United States Patent
Liang

(10) Patent No.: US 11,822,261 B2
(45) Date of Patent: Nov. 21, 2023

(54) WAFER EDGE EXPOSURE APPARATUS, WAFER EDGE EXPOSURE METHOD AND PHOTOLITHOGRAPHY DEVICE

(71) Applicant: CHANGXIN MEMORY TECHNOLOGIES, INC., Hefei (CN)

(72) Inventor: Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 39 days.

(21) Appl. No.: 17/593,206

(22) PCT Filed: Apr. 30, 2021

(86) PCT No.: PCT/CN2021/091633
§ 371 (c)(1),
(2) Date: Sep. 12, 2021

(87) PCT Pub. No.: WO2021/233121
PCT Pub. Date: Nov. 25, 2021

(65) Prior Publication Data
US 2022/0308469 A1    Sep. 29, 2022

(30) Foreign Application Priority Data

May 19, 2020   (CN) .......................... 202010423426.3

(51) Int. Cl.
*G03F 7/20*       (2006.01)
*G03F 9/00*       (2006.01)

(52) U.S. Cl.
CPC .................................. *G03F 9/7065* (2013.01)

(58) Field of Classification Search
CPC ........ G03F 9/7065; G03F 7/2022; G03F 1/00; G03F 7/70733; G03F 7/70775; G03F 7/7085; H01L 21/02; H01L 21/02021
See application file for complete search history.

(56) References Cited

U.S. PATENT DOCUMENTS 5,824,457 A    10/1998  Liu et al.
7,277,156 B2   10/2007  Jung
(Continued)

FOREIGN PATENT DOCUMENTS

CN    101241319 A    8/2008
CN    102608861 A    7/2012
(Continued)

OTHER PUBLICATIONS

International Search Report (ISR) in PCT/CN2021/091633 dated Jul. 30, 2021.
(Continued)

*Primary Examiner* — Mesfin T Asfaw
(74) *Attorney, Agent, or Firm* — SYNCODA LLC; Feng Ma

(57) ABSTRACT

A wafer edge exposure apparatus includes a wafer carrying module, a reticle, a reticle driving module, an alignment module, an exposure module, and a control module; the wafer carrying module is configured to carry the wafer and drive the wafer to rotate; the wafer includes a valid region and an edge region surrounding the valid region; the reticle driving module is configured to drive the reticle to rotate; the alignment unit is configured to detect the alignment state of the reticle with the wafer; and the control module is configured to control the movement state of the wafer carrying module and the reticle driving module and configured to control the exposure module to perform wafer edge exposure on the wafer.

19 Claims, 9 Drawing Sheets

(56) References Cited

U.S. PATENT DOCUMENTS

| | | | |
|---|---|---|---|
| 8,115,938 B2 | 2/2012 | Van Haren | |
| 2009/0123874 A1* | 5/2009 | Nagayama | G03F 9/7096 |
| | | | 430/311 |
| 2010/0285399 A1 | 11/2010 | Huang et al. | |
| 2011/0194086 A1* | 8/2011 | Chien | G03F 7/2022 |
| | | | 355/55 |
| 2012/0268721 A1 | 10/2012 | Yang | |

FOREIGN PATENT DOCUMENTS

| | | |
|---|---|---|
| CN | 104950582 A | 9/2015 |
| CN | 105372941 A | 3/2016 |
| CN | 108319057 A | 7/2018 |
| CN | 109669321 A | 4/2019 |
| KR | 20050112910 A | 12/2005 |

OTHER PUBLICATIONS

China first office action in Application No. 202010423426.3, dated Dec. 5, 2022.

\* cited by examiner

WAFER EDGE EXPOSURE APPARATUS, WAFER EDGE EXPOSURE METHOD AND PHOTOLITHOGRAPHY DEVICE

CROSS-REFERENCE TO RELATED APPLICATIONS

This application is a national stage of International Application No. PCT/CN2021/091633 filed on Apr. 30, 2021, which claims priority to Chinese Patent Application No. 202010423426.3 filed on May 19, 2020. The disclosures of these applications are hereby incorporated by reference in their entirety.

TECHNICAL FIELD

The present application relates to the technical field of semiconductor manufacturing, and in particular to a wafer edge exposure apparatus, a wafer edge exposure method and a photolithography device.

BACKGROUND

With the development of integrated circuits, the increased density of transistors and reduced critical dimensions, defects generated during the photolithography process have an important and direct impact on the yield and quality of devices. The cleanliness and definition of the wafer boundary become more important. In the photolithography process, the photoresist is spin-coated on the wafer surface, and the photoresist is accumulated on the upper and lower surfaces near the wafer boundary. In the subsequent etching or ion implantation process, the photoresist accumulated on the wafer boundary is likely to come into contact with the mechanical arm for the wafer, resulting in particle contamination. Therefore, in the photolithography process, photoresist edge removal is usually performed on the wafer surface to avoid this problem.

In the related art, methods for photoresist edge removal on the wafer surface mainly include chemical edge bead removal (EBR) and wafer edge exposure (WEE). The chemical edge bead removal is usually to spray a solvent to the edge of the wafer to eliminate the photoresist at the edge of the wafer in the process of coating photoresist. This method has the disadvantages of long edge bead removal time, high solvent consumption, and irregular photoresist edge trimming, which may cause wafer defects to affect the process yield. The wafer edge exposure is to perform wafer edge exposure by a WEE apparatus after the coating of photoresist and before the exposure.

Compared with chemical methods, although the position and width of the wafer edge to be removed can be controlled precisely by optical methods, the existing edge exposure patterns are concentric rings which will cause dies in the valid region to be partially exposed during the exposure, resulting in damage to the valid dies and the reduced process yield.

SUMMARY

Embodiments of the present application provide a wafer edge exposure apparatus, a wafer edge exposure method, and a photolithography device. The wafer edge exposure apparatus can avoid damage to the valid region of the wafer when performing wafer edge exposure and thus improve the product yield.

In the first aspect, an embodiment of the present application provides a wafer edge exposure apparatus configured to expose the edge of a wafer, the wafer comprising a valid region and an edge region surrounding the valid region, the edge region comprising at least one notch unit, the wafer edge exposure apparatus comprising a wafer carrying module, a reticle, a reticle driving module, an alignment module, an exposure module, and a control module; the wafer carrying module is configured to carry the wafer and drive the wafer to rotate; the shape of the reticle is the same as the shape of the valid region; the reticle driving module is connected to the reticle and is configured to drive the reticle to rotate; the alignment module comprises at least one set of alignment detection units, and the alignment detection units are configured to detect the alignment state of the reticle with the wafer; and the control module is connected to the wafer carrying module, the reticle driving module, the alignment module and the exposure module, and the control module is configured to control the movement state of the wafer carrying module and the reticle driving module and configured to control the exposure module to perform wafer edge exposure on the wafer when the alignment module detects that the reticle is aligned with the wafer.

Optionally, the reticle driving module comprises a first motor, and the rotation axis of the first motor is connected to the geometric center of the reticle.

Optionally, the alignment detection unit comprises a first light source and a photosensitive element, and the photosensitive surface of the photosensitive element faces the light outgoing surface of the first light source; the reticle and the wafer are arranged between the first light source and the photosensitive element, and when the reticle is aligned with the wafer, the light emitted by the first light source passes through the notch unit and is then received by the photosensitive element.

Optionally, the control module is further configured to control the wafer carrying module to drive the wafer to rotate and/or control the reticle driving module to drive the reticle to rotate until the reticle is aligned with the wafer, when the reticle is not aligned with the wafer.

Optionally, the first light source is located on a side of the reticle away from the wafer, and the photosensitive element is located on a side of the wafer away from the reticle and is fixedly arranged in the edge region of the wafer; and the alignment module further comprises a first position adjustment unit, the first position adjustment unit is configured to control the first light source to move to the edge of the wafer during the alignment of the reticle with the wafer, and to control the first light source to move back to the original position after the alignment is completed.

Optionally, the first position adjustment unit comprises a second motor, a first support structure, a first slide rail, and a second slide rail; and the first support structure is fixedly connected to the first light source, and the second motor is configured to drive the first support structure to move to the edge of the wafer along the first slide rail during the alignment of the reticle with the wafer and drive the first support structure to move back to the original position along the second slide rail after the alignment is completed.

Optionally, the photosensitive element is located on a side of the reticle away from the wafer, and the first light source is located on a side of the wafer away from the reticle and is fixedly arranged in the edge region of the wafer; and the alignment module further comprises a second position adjustment unit, the second position adjustment unit is configured to control the photosensitive element to move to the edge of the wafer during the alignment of the reticle with the wafer, and to control the photosensitive element to move back to the original position after the alignment is completed.

Optionally, the second position adjustment unit comprises a third motor, a second support structure, a third slide rail, and a fourth slide rail; and the second support structure is fixedly connected to the photosensitive element, and the third motor is configured to drive the second support structure to move to the edge of the wafer along the third slide rail during the alignment of the reticle with the wafer and drive the second support structure to move back to the original position along the fourth slide rail after the alignment is completed.

Optionally, the exposure module is located on a side of the reticle away from the wafer, the exposure module comprises a second light source and an exposure optics, the second light source is configured to emit light beams required for exposure of the edge of the wafer, and the exposure optics is configured to converge the light beams to the edge region of the wafer.

Optionally, the surface of the wafer is coated with photoresist, the valid region comprises a plurality of valid dies, and the edge region comprises at least one invalid die.

In a second aspect, an embodiment of the present application further provides a wafer edge exposure method, executed by any one of the wafer edge exposure apparatuses described above, comprising: fixedly providing a wafer and a reticle on a wafer carrying module and a reticle driving module, respectively; controlling, by a control module, the wafer carrying module and/or the reticle driving module to rotate, to align the reticle with the wafer; and controlling, by a control module, an exposure module to expose an edge region of the wafer.

Optionally, the method further comprises: controlling, by a control module, the wafer carrying module and the reticle driving module to rotate synchronously to expose the entire edge region of the wafer.

In a third aspect, an embodiment of the present application further provides a photolithography apparatus, comprising any one of the wafer edge exposure apparatuses described above.

The wafer edge exposure apparatus in an embodiment of the present application comprises a wafer carrying module, a reticle, a reticle driving module, an alignment module, an exposure module, and a control module; the wafer comprises a valid region and an edge region surrounding the valid region, the edge region comprising at least one notch unit; the control module controls the wafer carrying module to drive the wafer to rotate and/or controls the reticle driving module to drive the reticle to rotate until the reticle is aligned with the wafer, and when the reticle is aligned with the wafer, light emitted by the first light source is received by the photosensitive element through the notch unit; the control module controls the movement state of the wafer carrying module and the reticle driving module and controls the exposure module to perform wafer edge exposure on the wafer when the alignment module detects that the reticle is aligned with the wafer; and by setting the reticle and the valid region of the wafer to the same shape, the reticle can accurately cover the valid region of the wafer, thereby avoiding damage to the valid region of the wafer during the wafer edge exposure process and improving the product yield.

DETAILED DESCRIPTION

Figure 1:
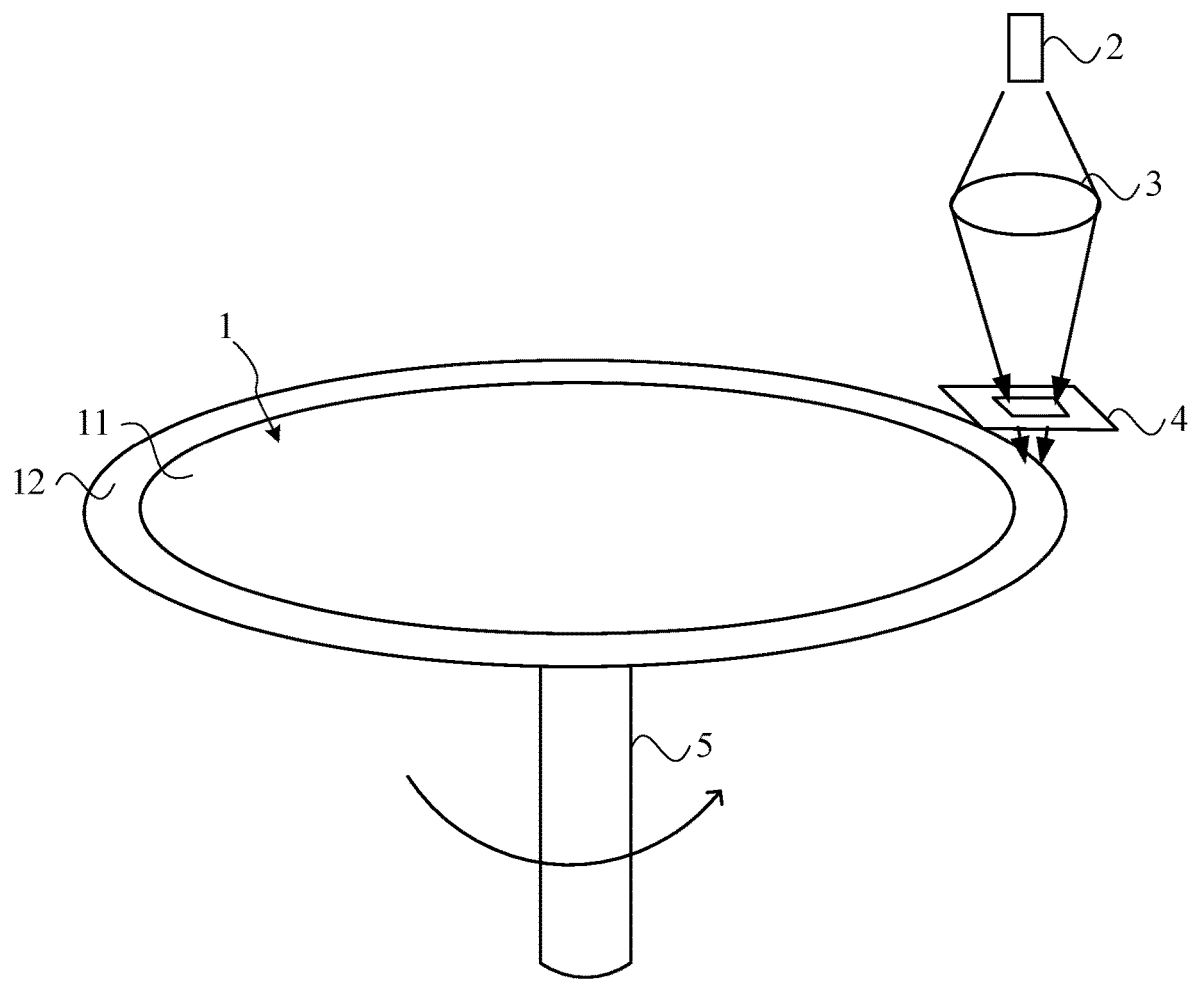
FIG. 1 is a schematic structure diagram of a wafer edge exposure apparatus.

The present application will be further described below with reference to the accompanying drawings by embodiments. It may be understood that the specific embodiments to be described herein are only used to explain the present application, rather than limiting the present application. In addition, it should be noted that, for ease of description, only a part of the structure related to the present application is shown in the accompanying drawings instead of all of the structure.

The terms used in the embodiments of the present application are only for the purpose of describing specific embodiments, and are not intended to limit the present application. It should be noted that terms such as "upper", "lower", "left", "right" used in the embodiments of the present application are provided from the angle shown in the drawings, and should not be construed as limiting the embodiments of the present application. In addition, in the context, it should be understood that, when it is mentioned that an element is formed "on" or "below" another element, it may be formed directly "on" or "below" another element, and also it may be formed "on" or "below" another element indirectly through an intermediate element. Terms such as "first" and "second" are just used for the purpose of description. They are just used to distinguish different components, without indicating any order, quantity or importance. For a person of ordinary skill in the art, the specific meaning of the terms in the present application can be understood in specific circumstances.

Figure 2:
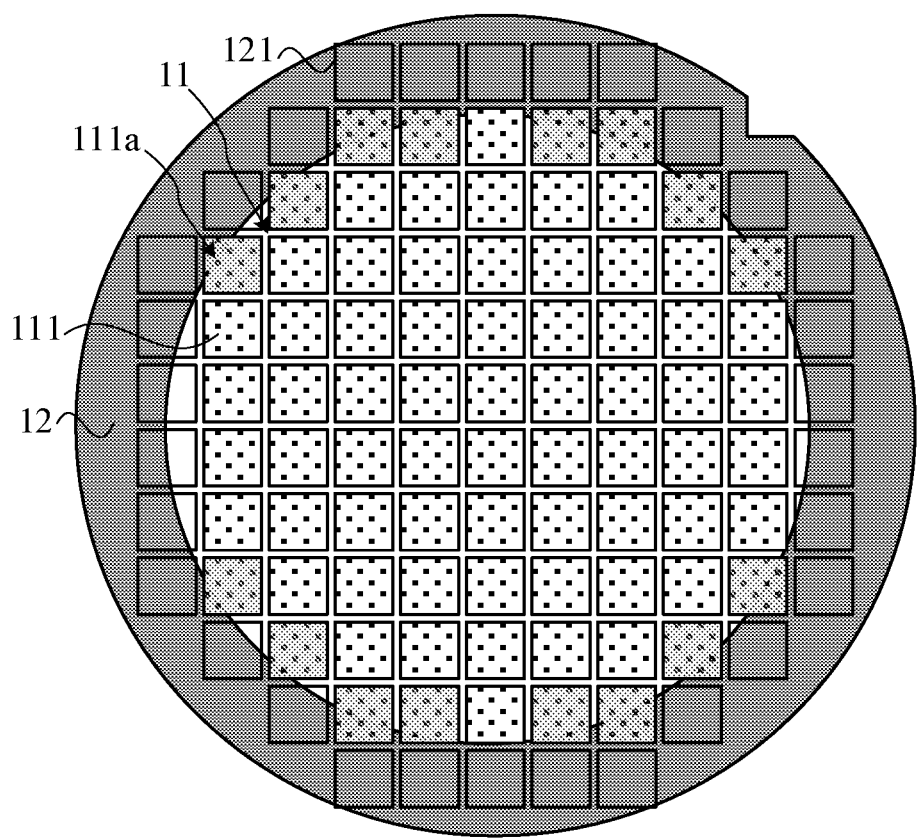
FIG. 2 is an overlooking schematic structure diagram of a wafer.

FIG. 1 is a schematic structure diagram of a wafer edge exposure apparatus; and FIG. 2 is an overlooking schematic structure diagram of a wafer. Referring to FIG. 1, the wafer edge exposure apparatus is configured to perform edge exposure on a wafer 1. The wafer 1 comprises a valid region 11 and an edge region 12 surrounding the valid region 11. The wafer edge exposure apparatus comprises a light source 2, a lens 3, a reticle 4 and the rotating mechanism 5. Light beams emitted by the light source 2 are converged onto the reticle 4 through the lens 3. Holes on the reticle 4 transmit light to realize edge exposure. The rotating mechanism 5 drives the wafer 1 to rotate to realize the exposure of the entire edge region 12. Referring to FIG. 2, the wafer comprises a plurality of valid dies 111 in the valid region 11 and invalid dies 121 in the edge region 12. Since the region formed by the edge exposure is ring-shaped, part of valid dies (for example, 111a in FIG. 2) at part of the edge of the valid region 11 may be exposed, resulting in reduced product yield in the subsequent photolithography process.

Figure 3:
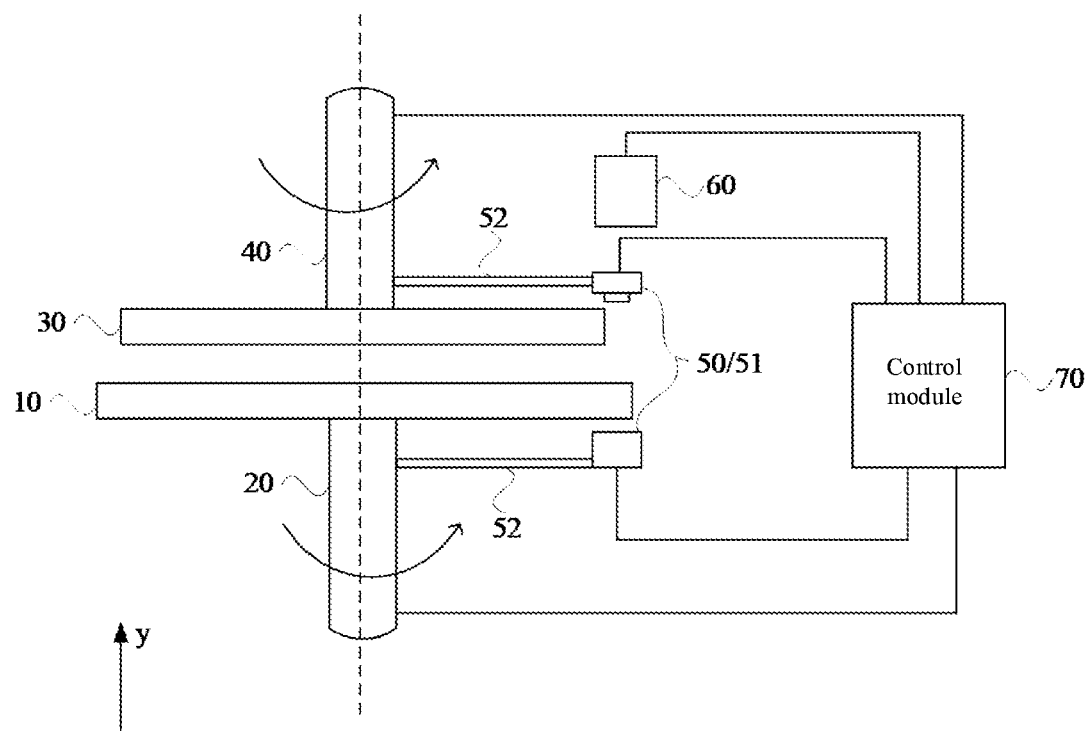
FIG. 3 is a schematic structure diagram of a wafer edge exposure apparatus according to an embodiment of the present application.
Figure 4:
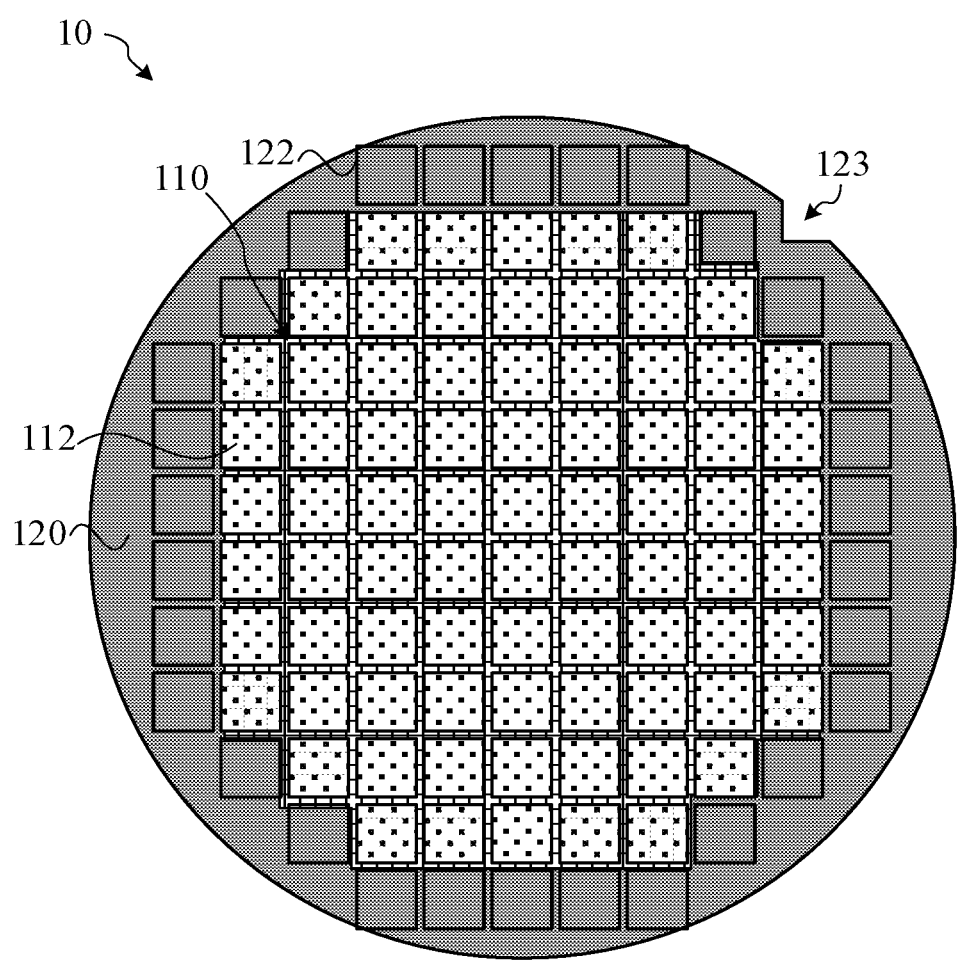
FIG. 4 is an overlooking schematic structure diagram of a wafer according to an embodiment of the present application.
Figure 5:
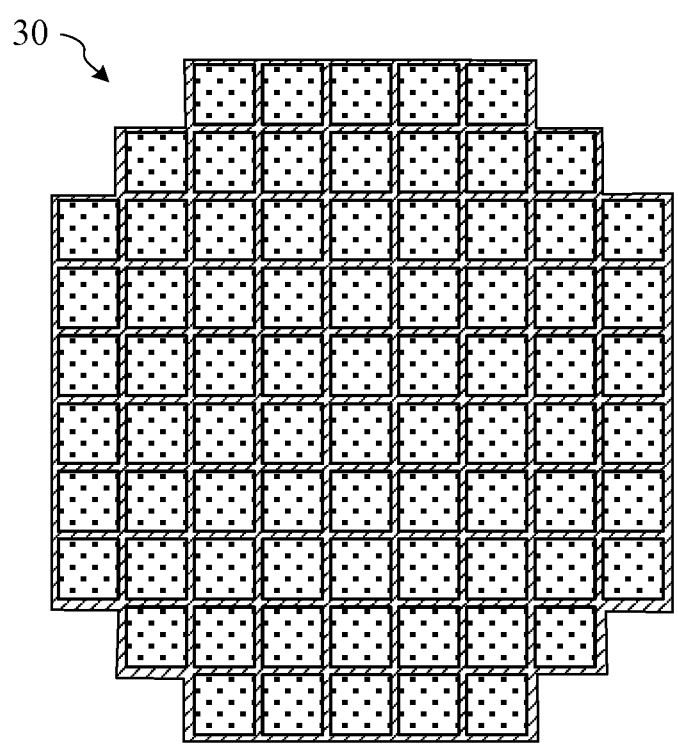
FIG. 5 is an overlooking schematic view of a reticle according to an embodiment of the present application.

In order to solve this problem, FIG. 3 is a schematic structure diagram of a wafer edge exposure apparatus according to an embodiment of the present application; FIG. 4 is an overlooking schematic structure diagram of a wafer according to an embodiment of the present application; and FIG. 5 is an overlooking schematic view of a reticle according to an embodiment of the present application. The wafer edge exposure apparatus in this embodiment is configured to expose the edge of a wafer 10. Referring to FIG. 4, the wafer 10 comprises a valid region 110 and an edge region 120 surrounding the valid region 110. The edge region 120 comprises at least one notch unit 123 (FIG. 4 shows only one notch unit 123 by way of example, which does not form any limitation to the embodiment of the present application); referring to FIG. 3, the wafer edge exposure apparatus comprises a wafer carrying module 20, a reticle 30, a reticle driving module 40, an alignment module 50, a exposure module 60, and a control module 70; the wafer carrying module 20 is configured to carry the wafer 10 and drive the wafer to rotate; referring to FIG. 5, the shape of the reticle 30 is the same as the shape of the valid region (referring to the valid region 110 in the valid region); referring to FIG. 3, the reticle driving module 40 is connected to the reticle 30 and is configured to drive the reticle 30 to rotate; the alignment module 50 comprises at least one set of alignment detection units 51 (FIG. 3 shows one set of alignment detection units by way of example, which does not form any limitation to the embodiment of the present application), and the alignment detection units 51 are configured to detect the alignment state of the reticle 30 with the wafer 10; and the control module 70 is connected to the wafer carrying module 20, the reticle driving module 40, the alignment module 50 and the exposure module 60, and the control module 70 is configured to control the movement state of the wafer carrying module 20 and the reticle driving module 40 and configured to control the exposure module 60 to perform wafer edge exposure on the wafer 10 when the alignment module detects 50 that the reticle 30 is aligned with the wafer 10.

In this embodiment, the shape of the reticle 30 is designed to be the same as the shape of the valid region 110 of the wafer 10. When edge exposure is performed, the reticle 30 overlaps the valid region 110 of the wafer 10, thereby exposing the edge region 120 of the wafer. Optionally, referring to FIG. 4, the surface of the wafer 10 is coated with photoresist (not shown in FIG. 4). The valid region 110 comprises a plurality of valid dies 112, and the edge region comprises at least one invalid die 122. In a specific implementation, the area of the reticle 30 is less than the area of the wafer 10. When the reticle 30 is aligned with the wafer 10, the alignment may be detected by the alignment detection unit. During the edge exposure, the reticle 30 completely covers the valid region 110 of the wafer 10, that is, covers all the valid dies 112 and exposes only the invalid die 122 in the edge region 120, thereby avoiding the effect of exposure on the valid region.

Exemplarily, referring to FIG. 3, the wafer carrying module 20 can drive the wafer 10 to rotate around an axis in y direction, and the reticle driving module 40 can drive the reticle 30 to rotate around the axis in y direction until the alignment unit detects the notch unit, thereby implementing the alignment of the wafer 10 with the reticle 30 before exposure. In a specific implementation, there may be one or more notch units, which is not limited in the embodiment of the present application. The alignment module 50 is configured to detect the alignment state of the reticle 30 and the wafer 10. For example, it may be detected optically. There may be one or more alignment detection units 51. The area of the reticle 30 is less than the area of the wafer 10. When the reticle 30 is aligned with the wafer, the notch unit can transmit light. When the reticle 30 is not aligned with the wafer, because of being blocked by the reticle 30 or wafer 10, the notch unit cannot transmit the detection light emitted by the alignment module 50. When the reticle 30 is not aligned with the wafer 10, adjustment may be made by rotating the wafer 10 and/or the reticle 30. The exposure module 60 is configured to implement edge exposure. Exemplarily, only a small region is exposed at a time, and then the wafer 10 and the reticle 30 are rotated synchronously to implement exposure of the entire edge region, thereby avoiding damage to the valid region of the wafer during the exposure process and improving the product yield.

Exemplarily, referring to FIG. 3, the wafer edge exposure apparatus further comprises a support structure 52 configured to support the alignment detection unit 51. It should be noted here that the connection of the support structure 52 to the wafer carrying module 20 and the reticle driving module 40 is only illustrative. In other embodiments, the support structure 52 may be connected to other fixing structures, such as the fixing brackets and top beams of the wafer edge exposure apparatus. In a specific implementation, it may be designed according to the actual mechanical structures. It is not limited in the embodiment of the present application. In addition, it should be noted that the alignment detection unit 51 and the exposure module 60 work at different stages, and they do not affect each other. If the alignment detection unit 51 may affect the exposure during the exposure, for example, it may block the reticle, a position moving apparatus may be provided to move the alignment detection unit 51 to prevent it from affecting the exposure.

In the technical solution of this embodiment, the wafer carrying module carries the wafer and drives the wafer to rotate; the alignment module detects the alignment state of the reticle with the wafer; by setting the reticle and the valid region of the wafer to the same shape, the reticle can accurately cover the valid region of the wafer when the reticle is aligned with the wafer; the control module controls the movement state of the wafer carrying module and the reticle driving module and controls the exposure module to perform wafer edge exposure on the wafer when the alignment module detects that the reticle is aligned with the wafer, thereby avoiding damage to the valid region of the wafer during the wafer edge exposure process and improving the product yield.

Based on the technical solution, optionally, the reticle driving module comprises a first motor, and the rotation axis of the first motor is connected to the geometric center of the reticle.

Figure 6:
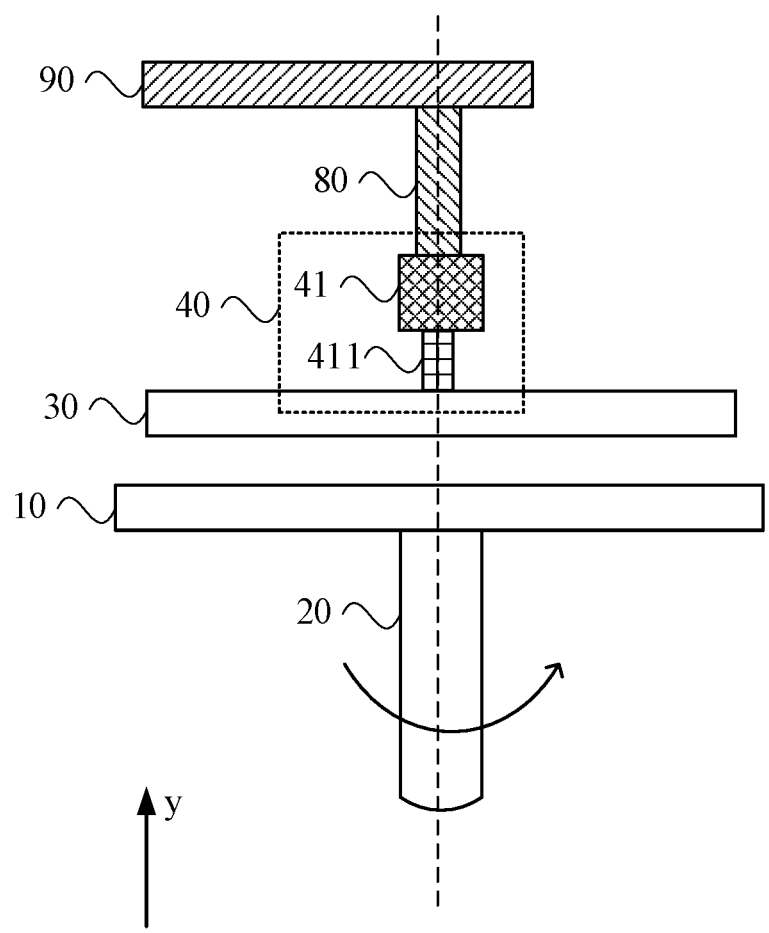
FIG. 6 is a partial schematic structure diagram of a wafer edge exposure apparatus according to an embodiment of the present application.

Exemplarily, FIG. 6 is a partial schematic structure diagram of a wafer edge exposure apparatus according to an embodiment of the present application. Referring to FIG. 6, the reticle driving module 40 comprises a first motor 41, and the rotation axis 411 of the first motor 41 is connected to the geometric center of the reticle 30. The first motor 41 is fixedly connected to the top beam 90 of the wafer edge exposure apparatus through a pull rod 80. By connecting the rotation axis 411 of the first motor 41 to the geometric center of the reticle 30, the structural torque may be balanced, and the force stressed on the reticle 30 when it rotates may be balanced.

Figure 7:
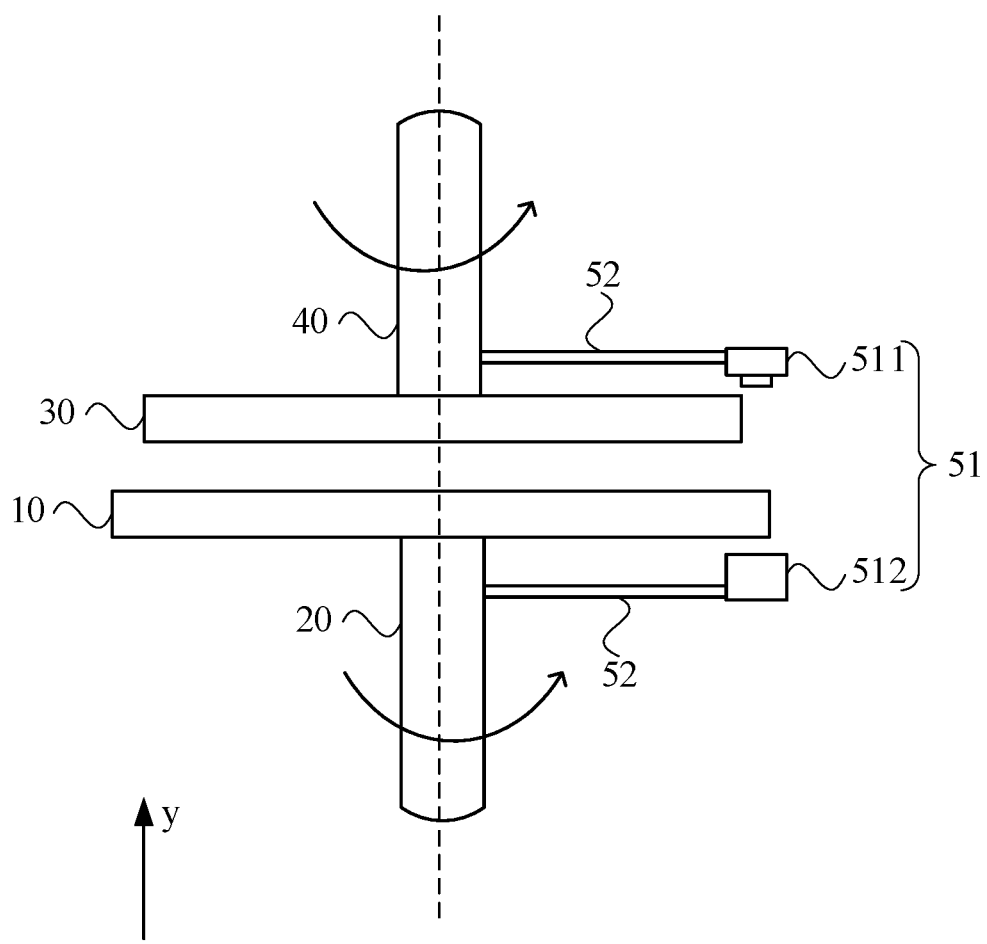
FIG. 7 is a partial schematic structure diagram of another wafer edge exposure apparatus according to an embodiment of the present application.

FIG. 7 is a partial schematic structure diagram of another wafer edge exposure apparatus according to an embodiment of the present application. Referring to FIG. 7, optionally, the alignment detection unit 51 comprises a first light source 511 and a photosensitive element 512 and the photosensitive surface of the photosensitive element 512 faces the light outgoing surface of the first light source 511; the reticle 30 and the wafer 10 are arranged between the first light source 511 and the photosensitive element 512, and when the reticle 30 is aligned with the wafer 10, the light emitted by the first light source 511 passes through the notch unit and is then received by the photosensitive element 512.

The first light source 511 may be a light emitting diode LED. The photosensitive element 512 may be a photodetector, for example a metal oxide semiconductor CMOS or a charge coupled device CCD. When the reticle 30 is aligned with the wafer 10, since the reticle 30 no longer blocks the notch unit, the intensity of light received by the photosensitive element 512 jumps. In this way, the transmission of light by the notch unit is used as an alignment mark of the wafer 10 and the reticle 30. In other embodiments, the alignment detection unit may be a microscopic imaging unit which can determine whether the wafer is aligned with the reticle by image recognition, but this may increase the cost.

Optionally, the control module is further configured to control the wafer carrying module to drive the wafer to rotate and/or control the reticle driving module to drive the reticle to rotate until the reticle is aligned with the wafer, when the reticle is not aligned with the wafer.

It may be understood that, when the reticle is not aligned with the wafer, the reticle will block the light emitted by the first light source, and as a result, the photosensitive element cannot receive the light. In this case, the wafer may be controlled to rotate, the reticle may be controlled to rotate, or both the wafer and the reticle may be controlled to rotate, until the reticle is aligned with the wafer. Then, the subsequent edge exposure is performed.

Figure 8:
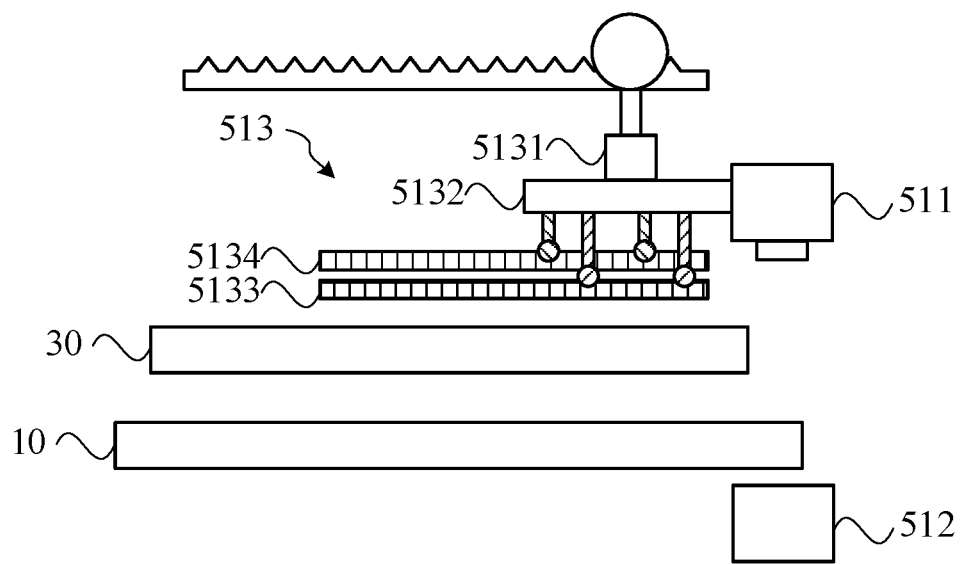
FIG. 8 is a partial schematic structure diagram of still another wafer edge exposure apparatus according to an embodiment of the present application.

FIG. 8 is a partial schematic structure diagram of still another wafer edge exposure apparatus according to an embodiment of the present application. Referring to FIG. 8, optionally, the first light source 511 is located on a side of the reticle 30 away from the wafer 10, and the photosensitive element 512 is located on a side of the wafer 10 away from the reticle 30 and is fixedly arranged in the edge region of the wafer 10; and the alignment module further comprises a first position adjustment unit 513, the first position adjustment unit is configured to control the first light source 511 to move to the edge of the wafer 10 during the alignment of the reticle 30 with the wafer 10, and to control the first light source 511 to move back to the original position after the alignment is completed. By controlling the first light source 511 to move back to the original position after the alignment is completed, it is possible to prevent the alignment module from affecting the exposure region.

Optionally, still referring to FIG. 8, the first position adjustment unit 513 comprises a second motor 5131, a first support structure 5132, a first slide rail 5133, and a second slide rail 5134; and the first support structure 5132 is fixedly connected to the first light source 511, and the second motor 5131 is configured to drive the first support structure 5132 to move to the edge of the wafer 10 along the first slide rail 5133 during the alignment of the reticle 30 with the wafer 10 and drive the first support structure 5132 to move back to the original position along the second slide rail 5134 after the alignment is completed.

Exemplarily, the second motor 5131 may be a servo motor, the first slide rail 5133 and the second pulley 5134 are provided with bogie wheels, and the servo motor is fixed on the first support structure 5132. Upon receiving a control signal, the servo motor drives the gears on the gear bar to rotate, thereby realizing the adjustment of the position of the first light source 511. The servo motor is equipped with a grating decoder circuit configured to calculate pulses and rotation angles. According to L=wr (w is the rotation angle, r is the gear radius), the displacement in the horizontal direction is measured.

It may be understood that the first position adjustment unit 513 in this embodiment comprises two slide rails which can stably support various components of the slide part. In other embodiments, only one slide rail may be provided. Thus, the structure is simplified.

Figure 9:
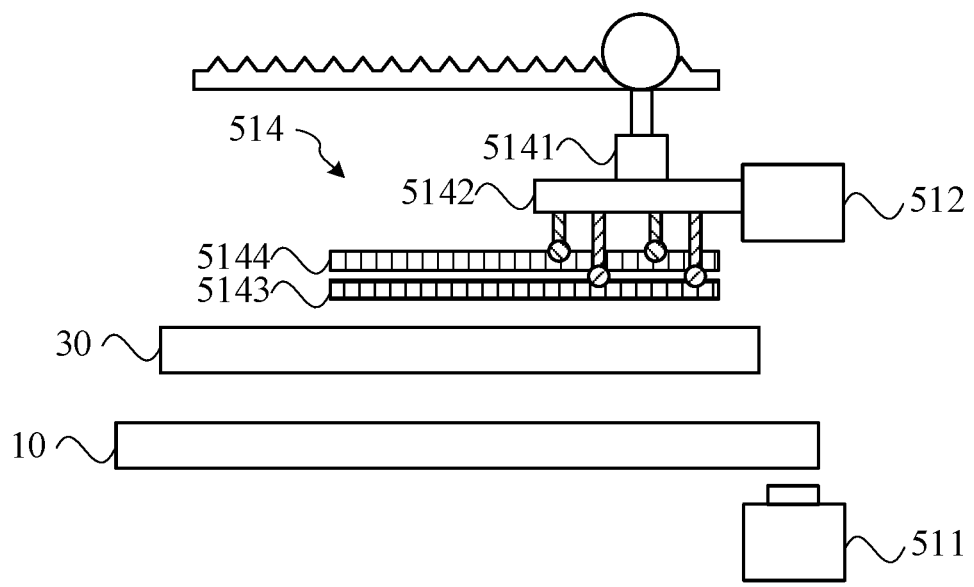
FIG. 9 is a partial schematic structure diagram of yet another wafer edge exposure apparatus according to an embodiment of the present application.

FIG. 9 is a partial schematic structure diagram of yet another wafer edge exposure apparatus according to an embodiment of the present application. Referring to FIG. 9, optionally, the photosensitive element 512 is located on a side of the reticle 30 away from the wafer 10, and the first light source 511 is located on a side of the wafer 10 away from the reticle 30 and is fixedly arranged in the edge region of the wafer 10; and the alignment module further comprises a second position adjustment unit 514, the second position adjustment unit is configured to control the photosensitive element 512 to move to the edge of the wafer 10 during the alignment of the reticle 30 with the wafer 10, and to control the photosensitive element 512 to move back to the original position after the alignment is completed. By controlling the photosensitive element 512 to move back to the original position after the alignment is completed, it is possible to prevent the alignment module from affecting the exposure region.

Optionally, still referring to FIG. 9, the second position adjustment unit 514 comprises a third motor 5141, a second support structure 5142, a third slide rail 5143, and a fourth slide rail 5144; and the second support structure 5142 is fixedly connected to the photosensitive element 512, and the third motor 5141 is configured to drive the second support structure 5142 to move to the edge of the wafer 10 along the third slide rail 5143 during the alignment of the reticle 30 with the wafer 10 and drive the second support structure 5142 to move back to the original position along the fourth slide rail 5144 after the alignment is completed.

Exemplarily, the third motor 5141 may be a servo motor, the third slide rail 5143 and the fourth pulley 5144 are provided with bogie wheels, and the servo motor is fixed on the second support structure 5142. Upon receiving a control signal, the servo motor drives the gears on the gear bar to rotate, thereby realizing the adjustment of the position of the photosensitive element 512. The servo motor is equipped with a grating decoder circuit configured to calculate pulses and rotation angles. According to L=wr (w is the rotation angle, r is the gear radius), the displacement in the horizontal direction is measured. In other embodiments, only one slide rail may be provided. Thus, the structure is simplified.

Figure 10:
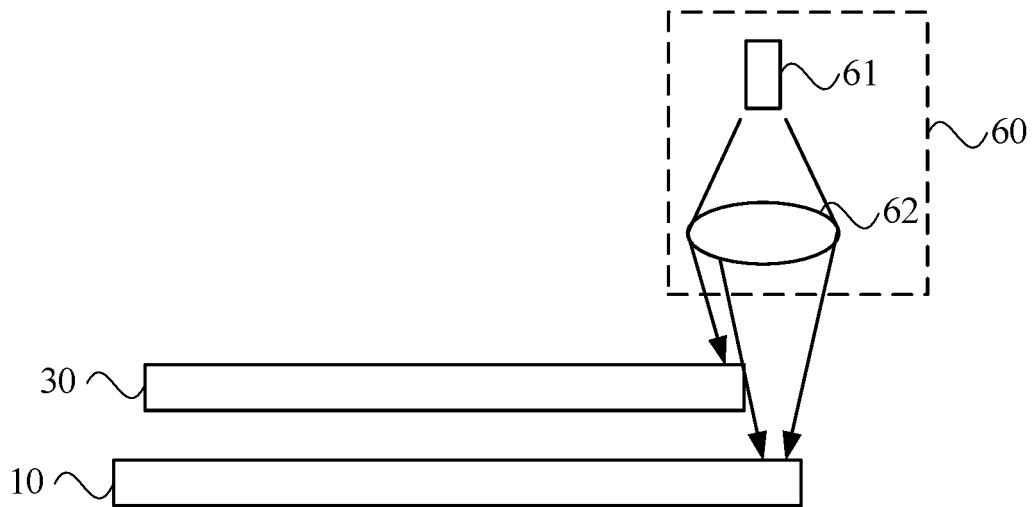
FIG. 10 is a partial schematic structure diagram of further another wafer edge exposure apparatus according to an embodiment of the present application.

FIG. 10 is a partial schematic structure diagram of further another wafer edge exposure apparatus according to an embodiment of the present application. Referring to FIG. 10, optionally, the exposure module 60 is located on a side of the reticle 30 away from the wafer 10, the exposure module 60 comprises a second light source 61 and an exposure optics 62, the second light source 61 is configured to emit light beams required for exposure of the edge of the wafer, and the exposure optics 62 is configured to converge the light beams to the edge region of the wafer 10.

The exposure optics 62 may be a lens or a set of lenses, which may be determined according to actual requirements in the specific implementation.

Figure 11:
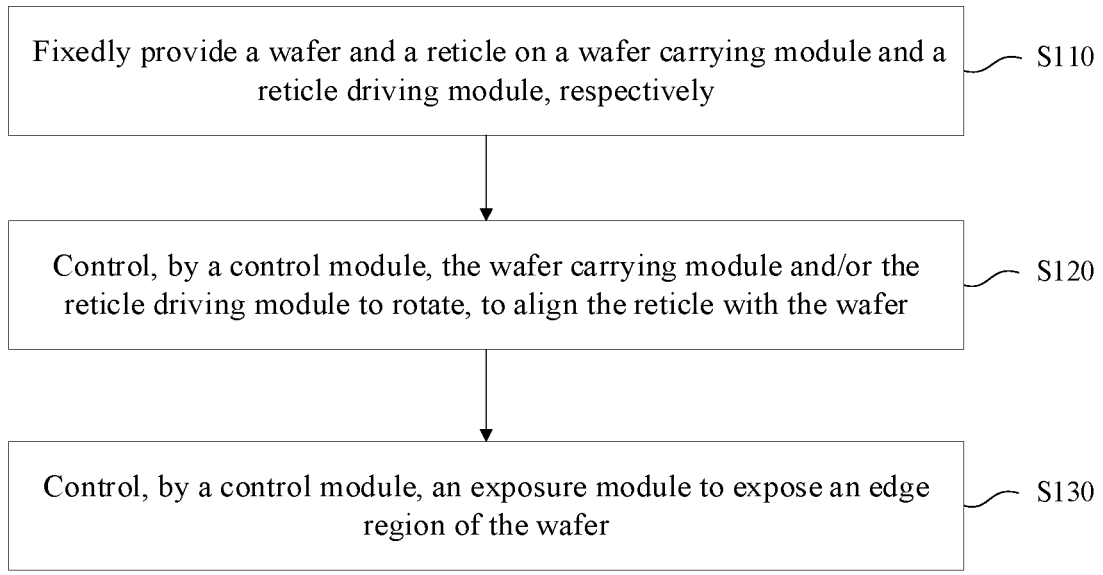
FIG. 11 is a schematic flowchart of a wafer edge exposure method according to an embodiment of the present application.

FIG. 11 is a schematic flowchart of a wafer edge exposure method according to an embodiment of the present application. The wafer edge exposure method may be executed by any one of wafer edge exposure apparatuses described in the above embodiments. The wafer edge exposure method comprises:

S110: A wafer and a reticle are fixedly provided on a wafer carrying module and a reticle driving module, respectively.

The wafer comprises a valid region and an edge region surrounding the valid region, and the edge region comprises at least one notch unit; and the shape of the reticle is the same as the shape of the valid region of the wafer.

S120: The control module controls the wafer carrying module and/or the reticle driving module to rotate, to align the reticle with the wafer.

In a specific implementation, the wafer may be controlled to rotate, the reticle may be controlled to rotate, or both the wafer and the reticle may be controlled to rotate, until the reticle is aligned with the wafer. It is not limited in the embodiment of the present application. The alignment state of the reticle with the wafer may be detected by the alignment module.

S130: The control module controls the exposure module to expose an edge region of the wafer.

In the technical solution of this embodiment, the wafer carrying module carries the wafer and drives the wafer to rotate; the alignment module detects the alignment state of the reticle with the wafer; by setting the reticle and the valid region of the wafer to the same shape, the reticle can accurately cover the valid region of the wafer when the reticle is aligned with the wafer; the control module controls the movement state of the wafer carrying module and the reticle driving module and controls the exposure module to perform wafer edge exposure on the wafer when the alignment module detects that the reticle is aligned with the wafer, thereby avoiding damage to the valid region of the wafer during the wafer edge exposure process and improving the product yield.

Based on the foregoing technical solutions, optionally, the wafer edge exposure method in this embodiment further comprises:

controlling, by a control module, the wafer carrying module and the reticle driving module to rotate synchronously to expose the entire edge region of the wafer.

By controlling the wafer carrying module and the reticle driving module rotate synchronously, the wafer and the reticle are always in alignment during the exposure process to achieve the exposure of the entire edge region and avoid damage to the valid dies during the exposure process.

An embodiment of the present application further provides a photolithography apparatus, comprising any one of wafer edge exposure apparatuses in the above embodiments.

Since the photolithography device in the embodiment of the present application comprises any one of wafer edge exposure apparatuses described in the above embodiments, they have the same or corresponding technical effects and will not be described in detail here.

Note that the above descriptions are only preferred embodiments of the present application and the technical principles applied. It may be understood by those skilled in the art that the present application is not limited to the specific embodiments described herein, and various apparent changes, adjustments and substitutions can be made without departing from the protection scope of the present application. Therefore, although the present application has been described in detail by the above embodiments, the present application is not limited to those embodiments and may comprise more other equivalent embodiments without departing from the concept of the present application. The scope of the present application is defined the appended claims.

What is claimed is:

1. A wafer edge exposure apparatus, configured to expose the edge of a wafer, the wafer comprising a valid region and an edge region surrounding the valid region, the edge region comprising at least one notch unit, the wafer edge exposure apparatus comprising a wafer carrying module, a reticle, a reticle driving module, an alignment module, an exposure module, and a control module;
   the wafer carrying module is configured to carry the wafer and drive the wafer to rotate;
   the overall shape of the reticle is the same as the overall shape of the valid region;
   the reticle driving module is connected to the reticle and is configured to drive the reticle to rotate;
   the alignment module comprises at least one set of alignment detection units, and the alignment detection units are configured to detect the alignment state of the reticle with the wafer; and
   the control module is connected to the wafer carrying module, the reticle driving module, the alignment module and the exposure module, and the control module is configured to control the movement state of the wafer carrying module and the reticle driving module, configured to control the wafer carrying module and the reticle driving module to respectively drive the wafer and the reticle to rotate synchronously to expose the entire edge region, and configured to control the exposure module to perform wafer edge exposure on the wafer when the alignment module detects that the reticle is aligned with the wafer;
   wherein the reticle being aligned with the wafer comprises all edges of the reticle overlapping with all edges of the valid region at the same time, and the reticle completely covers the valid region and exposes only the edge region during edge exposure.

2. The wafer edge exposure apparatus according to claim 1, wherein the reticle driving module comprises a first motor, and the rotation axis of the first motor is connected to the geometric center of the reticle.

3. A wafer edge exposure method executed by the wafer edge exposure apparatus according to claim 2, comprising:
   fixedly providing a wafer and a reticle on a wafer carrying module and a reticle driving module, respectively, the wafer carrying module driving the wafer to rotate, and the reticle driving module driving the reticle to rotate;
   controlling, by a control module, the wafer carrying module and/or the reticle driving module to rotate, to align the reticle with the wafer, the overall shape of the reticle being the same as the overall shape of the valid region, aligning the reticle with the wafer comprising all edges of the reticle overlapping with all edges of the valid region at the same time, and the reticle completely covering the valid region and exposing only the edge region during edge exposure;

controlling, by a control module, the wafer carrying module and the reticle driving module to respectively drive the wafer and the reticle to rotate synchronously to expose the entire edge region of the wafer; and controlling, by a control module, an exposure module to expose an edge region of the wafer.

4. A photolithography device comprising the wafer edge exposure apparatus according to claim 2.

5. The wafer edge exposure apparatus according to claim 1, wherein the alignment detection unit comprises a first light source and a photosensitive element, and the photosensitive surface of the photosensitive element faces the light outgoing surface of the first light source; the reticle and the wafer are arranged between the first light source and the photosensitive element, and when the reticle is aligned with the wafer, the light emitted by the first light source passes through the notch unit and is then received by the photosensitive element.

6. The wafer edge exposure apparatus according to claim 5, wherein the control module is further configured to control the wafer carrying module to drive the wafer to rotate and/or control the reticle driving module to drive the reticle to rotate until the reticle is aligned with the wafer, when the reticle is not aligned with the wafer.

7. The wafer edge exposure apparatus according to claim 5, wherein the first light source is located on a side of the reticle away from the wafer, and the photosensitive element is located on a side of the wafer away from the reticle and is fixedly arranged in the edge region of the wafer; and the alignment module further comprises a first position adjustment unit, the first position adjustment unit is configured to control the first light source to move to the edge of the wafer during the alignment of the reticle with the wafer, and to control the first light source to move back to the original position after the alignment is completed.

8. The wafer edge exposure apparatus according to claim 7, wherein the first position adjustment unit comprises a second motor, a first support structure, a first slide rail, and a second slide rail; and the first support structure is fixedly connected to the first light source, the second motor is configured to drive the first support structure to move to the edge of the wafer along the first slide rail during the alignment of the reticle with the wafer, and to drive the first support structure to move back to the original position along the second slide rail after the alignment is completed.

9. The wafer edge exposure apparatus according to claim 5, wherein the photosensitive element is located on a side of the reticle away from the wafer, and the first light source is located on a side of the wafer away from the reticle and is fixedly arranged in the edge region of the wafer; and the alignment module further comprises a second position adjustment unit, the second position adjustment unit is configured to control the photosensitive element to move to the edge of the wafer during the alignment of the reticle with the wafer, and to control the photosensitive element to move back to the original position after the alignment is completed.

10. The wafer edge exposure apparatus according to claim 9, wherein the second position adjustment unit comprises a third motor, a second support structure, a third slide rail, and a fourth slide rail; and the second support structure is fixedly connected to the photosensitive element, the third motor is configured to drive the second support structure to move to the edge of the wafer along the third slide rail during the alignment of the reticle with the wafer, and to drive the second support structure to move back to the original position along the fourth slide rail after the alignment is completed.

11. A wafer edge exposure method executed by the wafer edge exposure apparatus according to claim 5, comprising:

fixedly providing a wafer and a reticle on a wafer carrying module and a reticle driving module, respectively, the wafer carrying module driving the wafer to rotate, and the reticle driving module driving the reticle to rotate;

controlling, by a control module, the wafer carrying module and/or the reticle driving module to rotate, to align the reticle with the wafer, the overall shape of the reticle being the same as the overall shape of the valid region, aligning the reticle with the wafer comprising all edges of the reticle overlapping with all edges of the valid region at the same time, and the reticle completely covering the valid region and exposing only the edge region during edge exposure;

controlling, by a control module, the wafer carrying module and the reticle driving module to respectively drive the wafer and the reticle to rotate synchronously to expose the entire edge region of the wafer; and controlling, by a control module, an exposure module to expose an edge region of the wafer.

12. A photolithography device comprising the wafer edge exposure apparatus according to claim 5.

13. The wafer edge exposure apparatus according to claim 1, wherein the exposure module is located on a side of the reticle away from the wafer, the exposure module comprises a second light source and an exposure optics, the second light source is configured to emit light beams required for exposure of the edge of the wafer, and the exposure optics is configured to converge the light beams to the edge region of the wafer.

14. A wafer edge exposure method executed by the wafer edge exposure apparatus according to claim 13, comprising:

fixedly providing a wafer and a reticle on a wafer carrying module and a reticle driving module, respectively, the wafer carrying module driving the wafer to rotate, and the reticle driving module driving the reticle to rotate;

controlling, by a control module, the wafer carrying module and/or the reticle driving module to rotate, to align the reticle with the wafer, the overall shape of the reticle being the same as the overall shape of the valid region, aligning the reticle with the wafer comprising all edges of the reticle overlapping with all edges of the valid region at the same time, and the reticle completely covering the valid region and exposing only the edge region during edge exposure;

controlling, by a control module, the wafer carrying module and the reticle driving module to respectively drive the wafer and the reticle to rotate synchronously to expose the entire edge region of the wafer; and controlling, by a control module, an exposure module to expose an edge region of the wafer.

15. The wafer edge exposure apparatus according to claim 1, wherein the exposure module exposes only part of the edge region at a time.

16. A wafer edge exposure method executed by the wafer edge exposure apparatus according to claim 15, comprising:

fixedly providing a wafer and a reticle on a wafer carrying module and a reticle driving module, respectively, the wafer carrying module driving the wafer to rotate, and the reticle driving module driving the reticle to rotate;

controlling, by a control module, the wafer carrying module and/or the reticle driving module to rotate, to align the reticle with the wafer, the overall shape of the reticle being the same as the overall shape of the valid region, aligning the reticle with the wafer comprising all edges of the reticle overlapping with all edges of the valid region at the same time, and the reticle completely covering the valid region and exposing only the edge region during edge exposure;

controlling, by a control module, the wafer carrying module and the reticle driving module to respectively drive the wafer and the reticle to rotate synchronously to expose the entire edge region of the wafer; and controlling, by a control module, an exposure module to expose an edge region of the wafer.

17. The wafer edge exposure apparatus according to claim 1, wherein the surface of the wafer is coated with photoresist, the valid region comprises a plurality of valid dies, and the edge region comprises at least one invalid die.

18. A wafer edge exposure method, executed by the wafer edge exposure apparatus according to claim 1, comprising:

fixedly providing a wafer and a reticle on a wafer carrying module and a reticle driving module, respectively, the wafer carrying module driving the wafer to rotate, and the reticle driving module driving the reticle to rotate;

controlling, by a control module, the wafer carrying module and/or the reticle driving module to rotate, to align the reticle with the wafer, the overall shape of the reticle being the same as the overall shape of the valid region, aligning the reticle with the wafer comprising all edges of the reticle overlapping with all edges of the valid region at the same time, and the reticle completely covering the valid region and exposing only the edge region during edge exposure;

controlling, by a control module, the wafer carrying module and the reticle driving module to respectively drive the wafer and the reticle to rotate synchronously to expose the entire edge region of the wafer; and controlling, by a control module, an exposure module to expose an edge region of the wafer.

19. A photolithography device, comprising the wafer edge exposure apparatus according to claim 1.

* * * * *